United States Patent [19]

Tsubouchi et al.

[11] Patent Number: 4,589,189
[45] Date of Patent: May 20, 1986

[54] METHOD FOR PRODUCING A SCHOTTKY BARRIER LIGHT DETECTING DEVICE

[75] Inventors: Natsuro Tsubouchi; Masahiko Denda, both of Hyogo, Japan

[73] Assignee: Mitsubishi Denki Kabushiki Kaisha, Tokyo, Japan

[21] Appl. No.: 647,790

[22] Filed: Sep. 6, 1984

Related U.S. Application Data

[62] Division of Ser. No. 293,794, Aug. 18, 1981, Pat. No. 4,496,964.

[30] Foreign Application Priority Data

Aug. 19, 1980 [JP] Japan ..................... 55-114490

[51] Int. Cl.[4] .......................... H01L 21/443
[52] U.S. Cl. ........................ 29/571; 29/572; 29/591
[58] Field of Search ................ 29/572, 571, 591

[56] References Cited

U.S. PATENT DOCUMENTS

| | | | |
|---|---|---|---|
| 3,996,656 | 12/1976 | Cook | 148/187 X |
| 4,128,670 | 12/1978 | Gaensslen | 29/571 X |
| 4,304,042 | 12/1981 | Yeh | 29/571 |
| 4,305,200 | 12/1981 | Fu et al. | 29/571 |
| 4,319,395 | 3/1982 | Lund et al. | 29/571 |
| 4,329,706 | 5/1982 | Crowder et al. | 29/571 X |

*Primary Examiner*—George T. Ozaki
*Attorney, Agent, or Firm*—Sughrue, Mion, Zinn, Macpeak & Seas

[57] ABSTRACT

A device for detecting light having an improved sensitivity and a method for producing the device. N+ source and drain regions are formed on a P-type silicon substrate. The substrate is then covered with an oxidation resistant layer of SiO$_2$. A layer of Pt-Si is then deposited between the source and drain regions and a P-type polysilicon layer is deposited on the Pt-Si layer. The device is then annealed to form a Schottky junction between the polysilicon layer and the Pt-Si layer following which a gate electrode is formed on the polysilicon layer.

5 Claims, 1 Drawing Figure

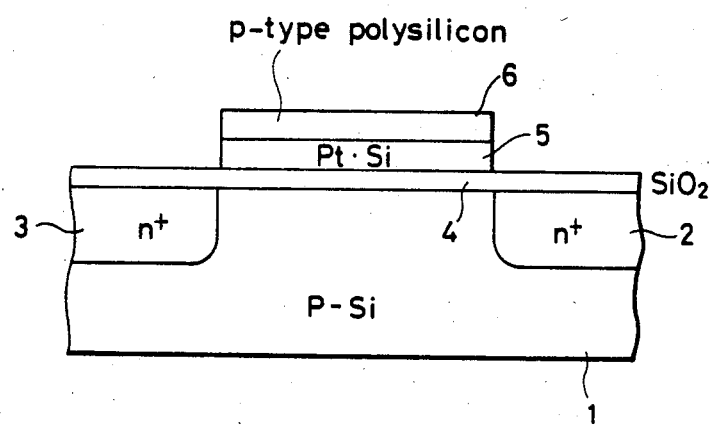

METHOD FOR PRODUCING A SCHOTTKY BARRIER LIGHT DETECTING DEVICE

This is a division of application Ser. No. 293,794, filed 08/18/81, now U.S. Pat. No. 4,496,964.

BACKGROUND OF THE INVENTION

The present invention relates to a device for detecting light in which a semiconductor element is used in a similar manner to that used for detecting infrared rays.

Conventionally, such a detecting device has employed a Schottky silicon type, silicon impurity doped type, or a compound semiconductor type structure, or the like. Each of these devices has certain disadvantages.

The Schottky silicon type, if used as a photocell, provides a uniform sensitivity and the production thereof is simple due to its use of a silicon substrate. However, the device has a narrow sensing range for the incident light and the signal output thereof is low. The silicon impurity doped type has a wide sensing range and the signal output thereof is high, but the production of the substrate thereof is more difficult than for the silicon Schottky type. The compound semiconductor type has a wide sensing range, but the production of the crystal substrate thereof is also more difficult than for the Schottky silicon type. Moreover, the leakage current thereof is very large.

A structure such as a silicon Schottky type, in comparison with the other structure, is most suitable for use in a monolithic circuit such as a "CCD" (charge-coupled device) in a two-dimensional array because conventional silicon LSI techniques are applicable for the fabrication thereof. However, the greatest disadvantage of this device is a lower sensitivity for detecting infrared rays.

Conventional structures of the Schottky silicon type, for example, are constructed by evaporating a metal such as platinum silicide or gold onto a surface of P-type silicon substrate having a specific resistance of about 10 Ω-cm. Schottky junctions formed between the metal and the P-type silicon substrate can be used for detecting infrared rays.

Usually, the barrier height between Pt-Si and P-type silicon is 0.275 eV, and that between Au and P-type is 0.25 eV. The detectable wavelength, based on quantum mechanics, calculated from these barrier values is 4.47 μm in the case of Pt-Si and 4.92 μm in the case of Au. Therefore, the ratio of detecting sensitivity D is usually about $10^9$ cm $Hz^{\frac{1}{2}}W^{-1}$, that is, this value is 1 to 2 orders of magnitude lower than that obtainable with other more desirable methods.

SUMMARY OF THE INVENTION

A primary object of the present invention is to provide an improved structure for a device for detecting light.

Overcoming the above noted defects, the invention provides a novel device for detecting light including a predetermined conductivity type semiconductor substrate having a surface region, a source region and a drain region of a conductivity type opposite that of the surface region, an oxidation resistant layer formed on the surface region, a metal or a metal silicide layer formed on the oxidation resistant layer between the source region and the drain region, and a polysilicon layer used as a guard electrode formed on the metal or metal silicide layer.

BRIEF DESCRIPTION OF THE DRAWINGS

The single accompanying FIGURE shows a cross-sectional view of a device for detecting light according to the present invention.

DESCRIPTION OF THE PREFERRED EMBODIMENTS

A preferred embodiment according to the present invention will be described with reference to the accompanying drawing.

In the FIGURE, numeral 1 designates a P-type silicon substrate forming a main semiconductor body, 2 and 3 N+ impurity regions, 4 a silicon dioxide layer, 5 a platinum silicide layer, 6 a polysilicon layer. This structure is easily produced with conventional well-known techniques. N+ impurity regions 2 and 3 are formed on the P-type silicon substrate 1 using a silicon dioxide mask. These two regions become a source region and drain region, respectively, for a "MOS" transistor, as will become more clear from the following description.

Further, a silicon dioxide layer 4 is formed thereon by annealing or the "CVD" method. Following that, a platinum layer is formed thereon by sputtering. Next, a polysilicon layer 6 doped with boron is formed thereon by a plasma CVD method. Preferably, the impurity density of the P-type polysilicon layer is less than $10^{17}$ atoms/cm³.

Following this, the device thus formed is annealed in a nitrogen atmosphere at a temperature of 600° C. During annealing, the polysilicon reacts with the platinum forming the Pt-Si layer 5 and the polysilicon layer 6 by reaction at the interface. Then a Schottky junction is formed between the layers 5 and 6. Further, the portion of the Pt-Si layer 5 and the polysilicon layer 6 other than a gate region of a "MOS" transistor is etched using a conventional photolithographic method. A cross-sectional view of the device thus constructed is shown in the accompanying drawing. Next, between the source region 2 and the drain region 3, the gate electrode 6 is formed as a metal lead for connection, again using a conventional method.

The operation of the device thus constructed will be described.

The Schottky diode formed by the Pt-Si layer 5 and the P-type polysilicon layer 6 has relatively ideal characteristics, the same as that of a single crystal silicon. In order to further increase the sensitivity of the device, it is operated at a temperature of about 77° K. At the same time, the mobility of carriers in the "MOS" transistor thus formed is increased to a desired level.

In operation, the substrate 1 and the source 2 are grounded and the drain 3 is connected through a load resistor to a positive voltage source. Thus, the Schottky junction formed between the layers 5 and 6 is reverse biased. Therefore, the Pt-Si layer 5 holds a positive charge so that the "MOS" transistor is in the "on" state. Thereby, a channel current flows, the magnitude of which is determined by the load resistance and the channel resistance.

In this state, upon irradiation with infrared rays on the upper surface of the P-type polysilicon layer 6, the positive charge held in the Pt-Si layer 5 is discharged into the P-type polysilicon layer 6. Therefore, the positive voltage of the Pt-Si layer 5 is shifted in a negative direction. This potential change reduces the channel current. Specifically, a potential change $\Delta V_G$ of the Pt-Si layer 5 causes a channel current change $\Delta I_D$. This amplification factor corresponds to the transconductance of the "MOS" transistor. The amplification factor is regulated by the channel length, channel width, and silicon dioxide layer thickness. Furthermore, it is possible to vary this value as desired. Accordingly, with the device thus constructed, an electric charge generated by irradiation with infrared rays is converted into a current change. Moreover, the amount of this current change can be set as desired.

According to the present invention, the sensitivity of the device is effectively increased over that of a conventional Schottky type detector for infrared rays due to the amplification action of the transistor.

In the embodiment described, the present invention is described with reference to a "MOS" transistor. However, an oxidation-resistant layer of other than silicon dioxide is also applicable with the present invention. Also, metals such as gold and palladium are applicable in place of Pt-Si.

Moreover, according to the present invention, it is possible to detect light having wavelengths other than infrared.

What is claimed is:

1. A method for producing a device for detecting light comprising the steps of: providing a semiconductor substrate of a first conductivity type; forming first and second impurity regions in a surface of said semiconductor substrate of a second conductivity type; forming an oxidation resistant layer upon said first and second impurity regions and remaining portions of said surface of said semiconductor substrate; forming a metallic layer on said oxidation resistant layer between said first and second impurity regions; and forming a polysilicon layer on said metallic layer.

2. The method of claim 1 wherein said metallic layer comprises a metal selected from the group consisting of gold, platinum and palladium.

3. The method of claim 1 wherein said metallic layer comprises platinum silicide.

4. A method for producing a device for detecting light comprising the steps of: providing a P-type silicon substrate; forming N+ source and drain impurity regions in a surface of said semiconductor substrate; forming a silicon dioxide layer over said source and drain regions and a remaining portion of said surface of said substrate between said source and drain regions; forming a platinum layer on said silicon dioxide layer; forming a polysilicon layer on said platinum layer; annealing said device thus formed in a nitrogen atmosphere at a temperature of approximately 600° C. to react said platinum with said polysilicon layer to form a Pt-Si layer; and forming a gate electrode upon remaining portions of an upper surface of said polysilicon layer.

5. The method of claim 4 wherein said polysilicon layer comprises a P-type layer having a doping density of less than $10^{17}$ atoms/cm$^3$.

* * * * *